(12) United States Patent
Lu et al.

(10) Patent No.: US 9,461,595 B2
(45) Date of Patent: Oct. 4, 2016

(54) INTEGRATOR FOR CLASS D AUDIO AMPLIFIER

(71) Applicant: QUALCOMM Incorporated, San Diego, CA (US)

(72) Inventors: Jingxue Lu, San Diego, CA (US); Matthew David Sienko, San Digeo, CA (US); Ankit Srivastava, San Diego, CA (US); Manu Mishra, San Diego, CA (US)

(73) Assignee: QUALCOMM INCOPORATED, San Diego, CA (US)

( * ) Notice: Subject to any disclaimer, the term of this patent is extended or adjusted under 35 U.S.C. 154(b) by 4 days.

(21) Appl. No.: 14/210,905

(22) Filed: Mar. 14, 2014

(65) Prior Publication Data
US 2015/0263676 A1    Sep. 17, 2015

(51) Int. Cl.
| | |
|---|---|
| H03F 1/02 | (2006.01) |
| H03F 3/185 | (2006.01) |
| H03F 3/45 | (2006.01) |
| H03F 1/30 | (2006.01) |
| H03F 3/183 | (2006.01) |
| H03F 3/217 | (2006.01) |

(52) U.S. Cl.
CPC .............. *H03F 1/0233* (2013.01); *H03F 1/30* (2013.01); *H03F 3/183* (2013.01); *H03F 3/185* (2013.01); *H03F 3/2173* (2013.01); *H03F 3/45076* (2013.01); *H03F 2200/03* (2013.01)

(58) Field of Classification Search
CPC ..................................... H03F 3/38; H03F 1/02
USPC ......................................... 327/336; 330/10, 9
See application file for complete search history.

(56) References Cited

U.S. PATENT DOCUMENTS

| | | | |
|---|---|---|---|
| 7,230,485 B2 | 6/2007 | De Cremoux et al. | |
| 7,312,657 B2 | 12/2007 | Kurokawa | |
| 7,795,960 B2 * | 9/2010 | Lyden ..................... | H03F 3/387 330/9 |
| 7,825,725 B2 | 11/2010 | Komatsu | |
| 7,834,685 B1 * | 11/2010 | Pertijs .................. | H03K 5/2472 327/124 |
| 2006/0197596 A1 | 9/2006 | Chen et al. | |
| 2007/0210861 A1 | 9/2007 | Chen | |
| 2007/0229159 A1 | 10/2007 | Krishnan et al. | |
| 2010/0073214 A1 * | 3/2010 | Kawahito et al. ............ 341/155 | |
| 2011/0063027 A1 * | 3/2011 | Kishii et al. ................... 330/251 | |
| 2011/0096944 A1 | 4/2011 | Chee | |
| 2011/0305353 A1 | 12/2011 | Lang et al. | |
| 2013/0135057 A1 * | 5/2013 | Roithmeier ............. 331/117 FE | |
| 2013/0271214 A1 | 10/2013 | Van Holland | |
| 2015/0256272 A1 | 9/2015 | Weissman et al. | |

FOREIGN PATENT DOCUMENTS

EP    2562933 A1    2/2013

OTHER PUBLICATIONS

International Search Report and Written Opinion—PCT/US2015/016527—ISA/EPO—May 26, 2015, 13 pages.

* cited by examiner

*Primary Examiner* — Steven J Mottola
(74) *Attorney, Agent, or Firm* — Toler Law Group, PC

(57) ABSTRACT

An apparatus includes voltage-to-current conversion circuitry comprising a first voltage-to-current converter and a second voltage-to-current converter. The apparatus also includes a capacitor coupled to the first voltage-to-current converter and to the second voltage-to-current converter.

20 Claims, 8 Drawing Sheets

INTEGRATOR FOR CLASS D AUDIO AMPLIFIER

I. FIELD

The present disclosure is generally related to an integrator for a Class D audio amplifier.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Wireless telephones may include Class D audio amplifiers to amplify audio signals. Class D audio amplifiers may be subject to a low power supply rejection ratio (PSRR). For example, Class D audio amplifiers may reject a relatively low amount of noise from a power supply. A low PSRR may result in an increased amount of Global System for Mobile Communications (GSM) buzz (e.g., noise) during wireless communications. Conventional Class D amplifiers utilize matching feedback paths precisely to increase PSRR; however, increasing the PSRR via the feedback paths may involve matching of feedback network elements (e.g., two input resistors having relatively large resistances on corresponding differential input paths and two feedback resistors on corresponding feedback paths). Matching feedback network elements may result in increased die area.

III. BRIEF DESCRIPTION OF THE DRAWINGS

IV. DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Figure 1:
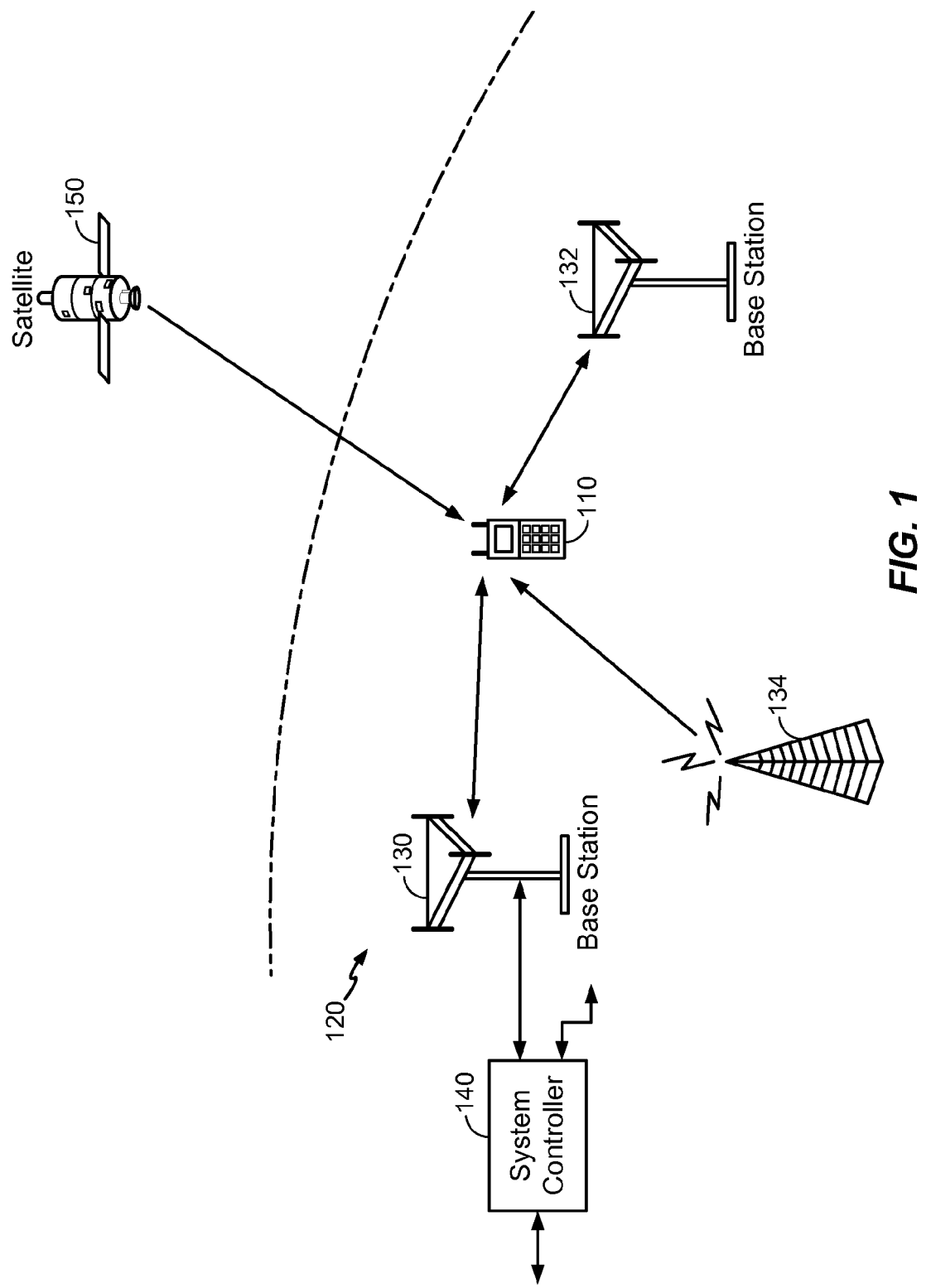
FIG. 1 shows a wireless device communicating with a wireless system.

FIG. 1 shows a wireless device 110 communicating with a wireless communication system 120. Wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless system may include any number of base stations and any set of network entities.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1x, EVDO, TD-SCDMA, GSM, 802.11, etc. In an exemplary embodiment, the wireless device 110 may include an integrator as described with respect to FIGS. 2-8.

Figure 2:
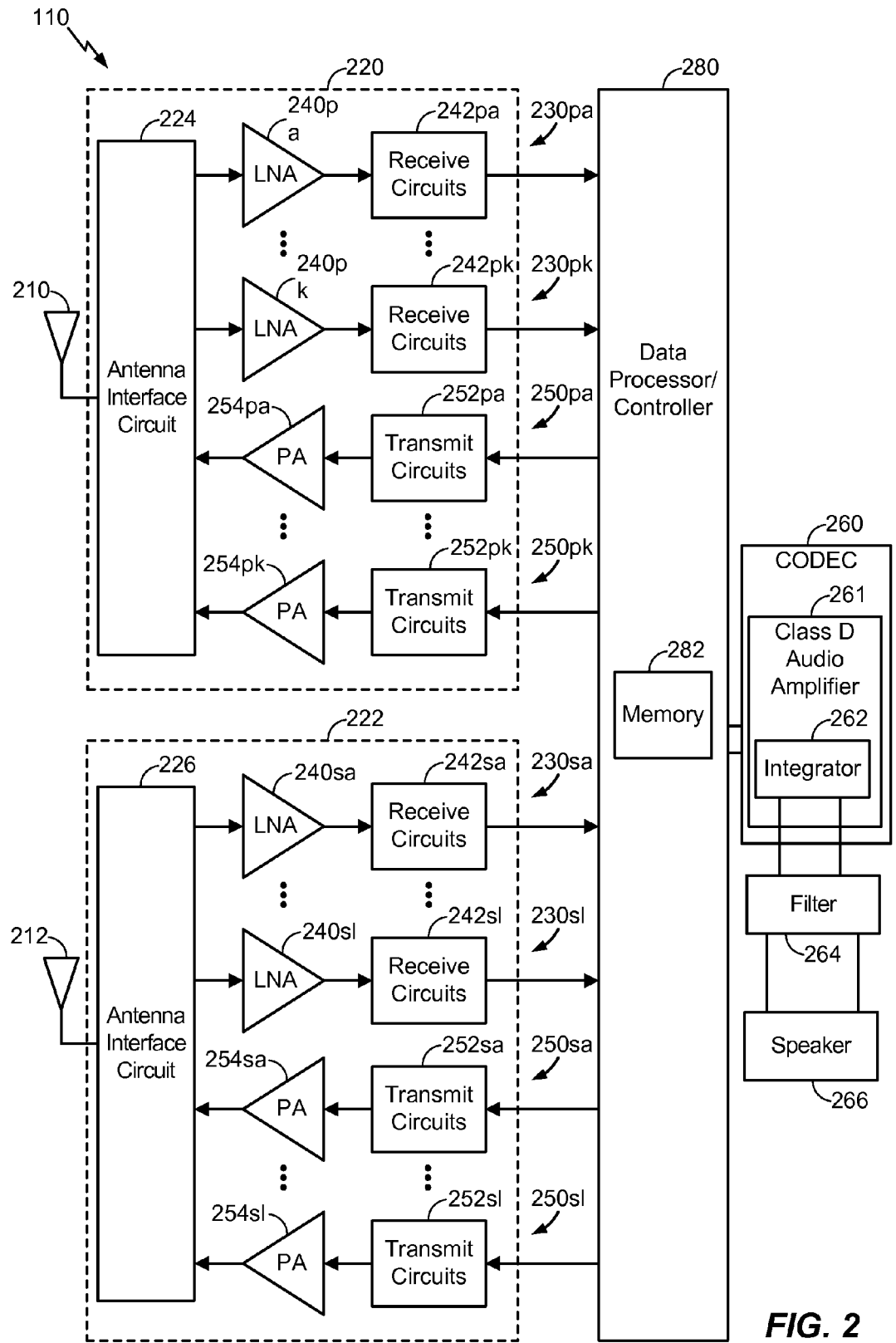
FIG. 2 shows a block diagram of the wireless device in FIG. 1.

FIG. 2 shows a block diagram of an exemplary design of wireless device 110 in FIG. 1. In this exemplary design, wireless device 110 includes a transceiver 220 coupled to a primary antenna 210, a transceiver 222 coupled to a secondary antenna 212, and a data processor/controller 280. Transceiver 220 includes multiple (K) receivers 230*pa* to 230*pk* and multiple (K) transmitters 250*pa* to 250*pk* to support multiple frequency bands, multiple radio technologies, carrier aggregation, etc. Transceiver 222 includes multiple (L) receivers 230*sa* to 230*sl* and multiple (L) transmitters 250*sa* to 250*sl* to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver 230 includes an LNA 240 and receive circuits 242. For data reception, antenna 210 receives signals from base stations and/or other transmitter stations and provides a received RF signal, which is routed through an antenna interface circuit 224 and presented as an input RF signal to a selected receiver. Antenna interface circuit 224 may include switches, duplexers, transmit filters, receive filters, matching circuits, etc. The description below assumes that receiver 230pa is the selected receiver. Within receiver 230pa, an LNA 240pa amplifies the input RF signal and provides an output RF signal. Receive circuits 242pa downconvert the output RF signal from RF to baseband, amplify and filter the downconverted signal, and provide an analog input signal to data processor 280. Receive circuits 242pa may include mixers, filters, amplifiers, matching circuits, an oscillator, a local oscillator (LO) generator, a phase locked loop (PLL), etc. Each remaining receiver 230 in transceivers 220 and 222 may operate in similar manner as receiver 230pa.

In the exemplary design shown in FIG. 2, each transmitter 250 includes transmit circuits 252 and a power amplifier (PA) 254. For data transmission, data processor 280 processes (e.g., encodes and modulates) data to be transmitted and provides an analog output signal to a selected transmitter. The description below assumes that transmitter 250pa is the selected transmitter. Within transmitter 250pa, transmit circuits 252pa amplify, filter, and upconvert the analog output signal from baseband to RF and provide a modulated RF signal. Transmit circuits 252pa may include amplifiers, filters, mixers, matching circuits, an oscillator, an LO generator, a PLL, etc. A PA 254pa receives and amplifies the modulated RF signal and provides a transmit RF signal having the proper output power level. The transmit RF signal is routed through antenna interface circuit 224 and transmitted via antenna 210. Each remaining transmitter 250 in transceivers 220 and 222 may operate in similar manner as transmitter 250pa.

FIG. 2 shows an exemplary design of receiver 230 and transmitter 250. A receiver and a transmitter may also include other circuits not shown in FIG. 2, such as filters, matching circuits, etc. All or a portion of transceivers 220 and 222 may be implemented on one or more analog integrated circuits (ICs), RF ICs (RFICs), mixed-signal ICs, etc. For example, LNAs 240 and receive circuits 242 may be implemented on one module, which may be an RFIC, etc. The circuits in transceivers 220 and 222 may also be implemented in other manners.

Data processor/controller 280 may perform various functions for wireless device 110. For example, data processor 280 may perform processing for data being received via receivers 230 and data being transmitted via transmitters 250. Controller 280 may control the operation of the various circuits within transceivers 220 and 222. A memory 282 may store program codes and data for data processor/controller 280. Data processor/controller 280 may be implemented on one or more application specific integrated circuits (ASICs) and/or other ICs.

A coder/decoder (CODEC) 260 may be coupled to the data processor 280. The CODEC 260 may include a Class D audio amplifier 261. The Class D audio amplifier 261 is a switching amplifier integrated into the CODEC 260 and is operable to adjust a magnitude of audio signals generated by (or provided to) the wireless device 110. For example, the Class D audio amplifier 261 may amplify audio speech signals received by the wireless device 110. In addition, the Class D audio amplifier 261 may amplify audio signals generated by the wireless device 110 (e.g., ringtone audio signals, MP3 audio signals, etc.). The amplified audio signals may be provided to (e.g., drive) a speaker 266 coupled to the CODEC 260. In an exemplary embodiment, the amplified audio signals may be filtered by a filter 264, and the filtered amplified audio signals may drive the speaker 266 (e.g., a headset, an earpiece, or a loud speaker of the wireless device 110).

The Class D audio amplifier 261 may include an integrator 262 for error control. For example, an output of the Class D audio amplifier 261 (e.g., the signal provided to the filter 264 or to the speaker 266) may be dependent on a pulse-width modulated signal and a power supply voltage amplitude. As explained in greater detail with respect to FIGS. 3-4, a feedback loop (e.g., a negative feedback) may be used to reduce errors based on variances in pulse-width modulated signals, power supply voltage amplitudes, and output impedance(s) of the Class D audio amplifier 261. The integrator 262 may integrate feedback voltage signals (e.g., feedback of output voltage signals of the Class D audio amplifier 261) with input voltage signals (e.g., voltage signals provided to the Class D audio amplifier 261) to control the linearity and performance of the Class D audio amplifier.

Wireless device 110 may support multiple band groups, multiple radio technologies, and/or multiple antennas. Wireless device 110 may include a number of LNAs to support reception via the multiple band groups, multiple radio technologies, and/or multiple antennas.

Figure 3:
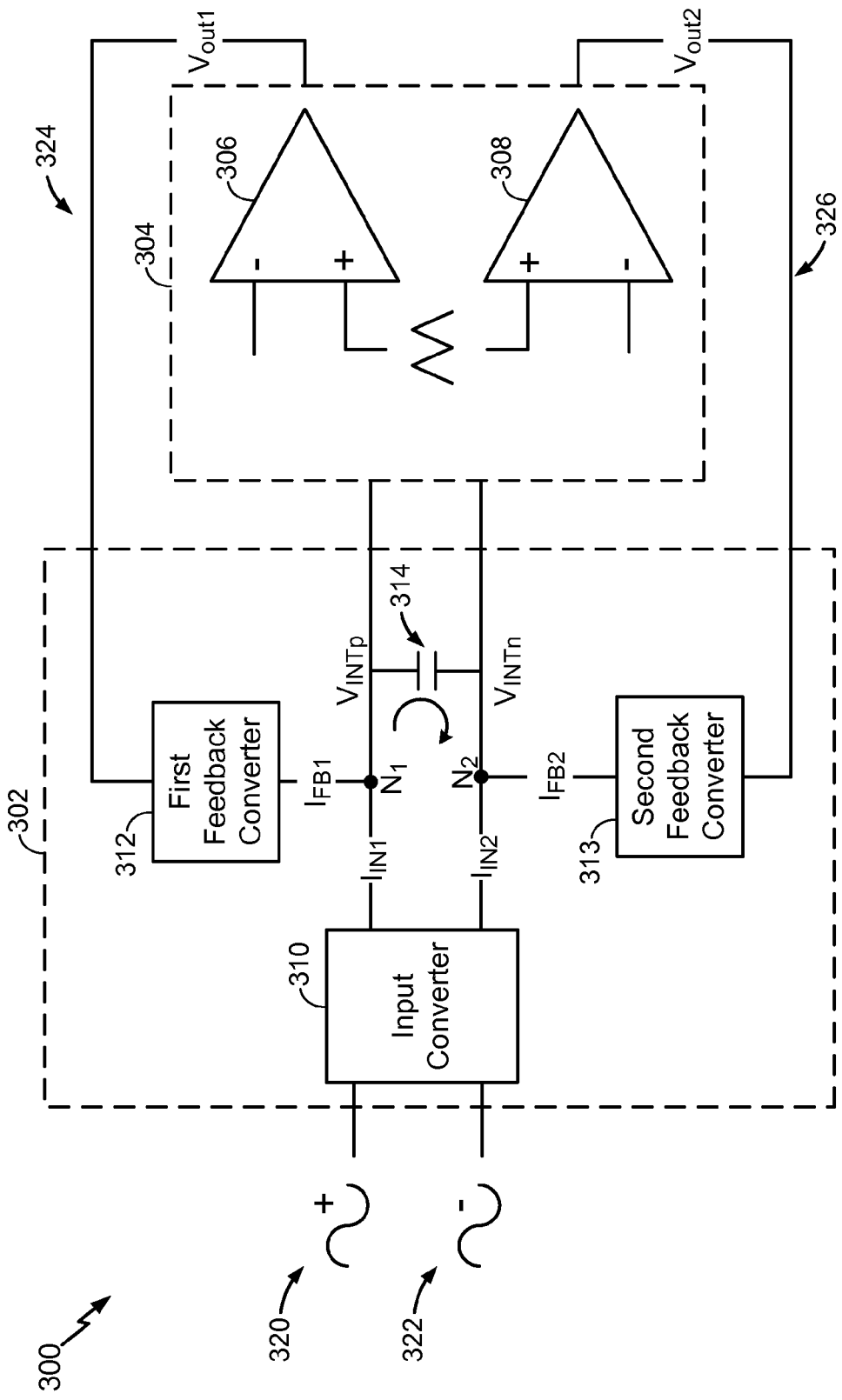
FIG. 3 is a block diagram that depicts an exemplary embodiment of a system that includes an integrator that is operable to increase power supply rejection ratio (PSRR)

Referring to FIG. 3, an exemplary embodiment of a system 300 that includes an integrator that is operable to increase power supply rejection ratio (PSRR) is shown. In an exemplary embodiment, the system 300 may correspond to a Class D audio amplifier implemented within the wireless device 110 of FIGS. 1-2. The system 300 includes an integrator 302 and a pulse width modulator 304. In a particular embodiment, the integrator 302 may correspond to the integrator 262 of FIG. 2. For example, the integrator 302 may be implemented in a Class D audio amplifier of a coder/decoder (CODEC) to enable the output of the Class D audio amplifier to be combined with the input to control the Class D audio amplifier.

The pulse width modulator 304 includes a pair of differential amplifiers 306, 308 and a pair of power switches (not shown). In an exemplary embodiment, the first differential amplifier 306 may operate as a first comparator circuit, and the second differential amplifier 308 may operate as a second comparator circuit. For example, a negative terminal of the first differential amplifier 306 may be coupled to receive a first differential waveform ($V_{INTp}$) (e.g., a first differential voltage signal), and a negative terminal of the second differential amplifier 308 may be coupled to receive a second differential waveform ($V_{INTn}$) (e.g., a second differential voltage signal). As explained below, the first differential waveform may correspond to a first integrator output voltage ($V_{INTp}$), and the second differential waveform may correspond to a second integrator output voltage ($V_{INTn}$). For example, in an exemplary embodiment, the negative terminal of the first differential amplifier 306 may be coupled to the positive terminal of a capacitor 314 and, the negative terminal of the second differential amplifier 308 may be coupled to the negative terminal of the capacitor 314. As explained below, the differential waveforms may be driven, at least in part, by the capacitor 314 of the integrator 302. A positive terminal of the first differential amplifier 306 and a positive terminal of the second differential amplifier 308 may be coupled to receive a triangle waveform. In an exemplary embodiment, the triangle waveform may be generated from a power supply and an oscillator.

The first differential amplifier 306 may be configured to compare the first differential waveform to the triangle waveform. When the value (e.g., voltage level) of the first differential waveform is greater than the value of the triangle waveform, the first differential amplifier 306 generates a first pulse width modulation signal having a logically high voltage level. The pulse width modulation signal may drive a first power switch (not shown) coupled to the output of the first differential amplifier 306 to generate a first differential output voltage signal ($V_{out1}$). The second differential amplifier 308 may be configured to compare the second differential waveform to the triangle waveform. When the value (e.g., voltage level) of the second differential waveform is greater than the value of the triangle waveform, the second differential amplifier 308 generates a second pulse width modulation signal having a logically high voltage level. The pulse width modulation signal may drive a second power switch (not shown) coupled to the output of the second differential amplifier 308 to generate a second differential output voltage signal ($V_{out2}$).

Thus, when the first differential waveform swings in the positive direction (e.g., increases in voltage) due to oscillation, the second differential waveform may swing in the negative direction (e.g., decrease in voltage) due to oscillation. This is turn may cause the first differential output voltage signal ($V_{out1}$) to increase in voltage level as the second differential output voltage signal ($V_{out2}$) decreases in voltage level. In a similar manner, when the first differential waveform swings in the negative direction, the second differential waveform may swing in the positive direction. This is turn may cause the first differential output voltage signal ($V_{out1}$) to decrease in voltage level as the second differential output voltage signal ($V_{out2}$) increases in voltage level.

The integrator 302 may include voltage-to-current conversion circuitry (e.g., an input converter 310, a first feedback converter 312, and a second feedback converter 313). Each converter 310, 312, 313 may be configured to convert a voltage signal into a current signal. For example, each converter 310, 312, 313 may be a voltage-to-current converter. In an exemplary embodiment, the input converter 310 is a first voltage-to-current converter and the feedback converters 312, 313 are a second voltage-to-current converter.

A pair of differential input voltage signals 320, 322 may be provided to the input converter 310. As described in greater detail with respect to FIG. 4, the input converter 310 may include a pair of resistors (not shown), a differential operational amplifier (not shown), and a pair of transistors (not shown). The input converter 310 may be configured to convert the pair of differential input voltage signals 320, 322 into a pair of differential input current signals ($I_{IN1}$, $I_{IN2}$). For example, the input converter 310 may convert the first differential input voltage signal 320 into the first differential input current signal ($I_{IN1}$), and the input converter 310 may convert the second differential input voltage signal 322 into the second differential input current signal ($I_{IN2}$).

The first differential output voltage signal ($V_{out1}$) may be provided to the first feedback converter 312 via a first feedback path 324, and the second differential output voltage signal ($V_{out2}$) may be provided to the second feedback converter 313 via a second feedback path 326. As described in greater detail with respect to FIG. 4, the first feedback converter 312 and the second feedback converter 313 may be integrated into single converter circuitry comprising a pair of resistors (not shown), a second differential amplifier (not shown), and a pair of transistors (not shown). The first feedback converter 312 may be configured to convert the first differential output voltage signal ($V_{out1}$) into a first feedback current signal ($I_{FB1}$), and the second feedback converter 313 may be configured to convert the second differential output voltage signal ($V_{out2}$) into a second feedback current signal ($I_{FB2}$).

The first differential output current signal ($I_{out1}$) may be combined (e.g., summed) with the first feedback current signal ($I_{IN1}$) at a first node ($N_1$) to generate a first combined current signal, and the second differential output current signal ($I_{out2}$) may be combined (e.g., summed) with the second feedback current signal ($I_{IN2}$) at a second node ($N_2$) to generate a second combined current signal.

The combined current signals may drive (e.g., charge and discharge) the capacitor 314 (e.g., a single differential integrating capacitor). For example, the first combined current signal may charge the capacitor 314 for a portion of a duty cycle (e.g., when the first combined current signal is based on high voltage levels associated with the first differential output voltage signal ($V_{out1}$)), and the second combined current signal may discharge the capacitor 314 for the other portion of the duty cycle (e.g., when the second combined current signal is based on high voltage levels associated with the second differential output voltage signal ($V_{out2}$)). The positive terminal of the capacitor 314 may be coupled to generate a first integrator output voltage ($V_{INTp}$), and the negative terminal of the capacitor 314 may be coupled to generate a second integrator output voltage ($V_{INTn}$). The capacitor 314 may provide voltages to portions of the pulse width modulator, as described in greater detail with respect to FIG. 4. For example, the positive terminal of the capacitor 314 may be coupled to the negative terminal of the first differential amplifier 306, and the negative terminal of the capacitor 314 may be coupled to the negative terminal of the second differential capacitor 308. Thus, the capacitor 314 may provide voltage levels of the differential waveforms provided to the differential amplifiers 306, 308.

The system 300 may increase a PSRR of a Class D audio amplifier while reducing die area. For example, the size of the capacitor 314 may be reduced to approximately twenty-five percent of the size of a capacitor typically used for an active resistor-capacitor integrator, which reduces die area. In addition, PSRR is not sensitive to the matching of the feedback networks (e.g., the resistors in the input converter 310 coupled to receive the pair of differential input voltage signals 320, 322 and the feedback resistors in the feedback converters 312, 313). Thus resistor size can be reduced.

Typically, the resistor size (width×length) of both input and feedback resistors is large (compared to the size of the resistors in the input converter 310 and the size of the resistors in the feedback converters 312, 313) to increase the matching and thus improve PSRR. However, the input converter 310 may provide a high impedance at the first node ($N_1$) and the second node ($N_2$) by converting the pair of differential input voltage signals 320, 322 into the pair of differential input current signals ($I_{IN1}$, $I_{IN2}$). As a result, the PSRR is less sensitive to the feedback and input resistors. The reduced sensitivity may enable enhanced (e.g., increased) PSRR with relatively small input resistors, which reduces die area. In an exemplary embodiment, the converters 310, 312, 313 may be "stacked" to further reduce die area, as described with respect to FIG. 4.

Figure 4:
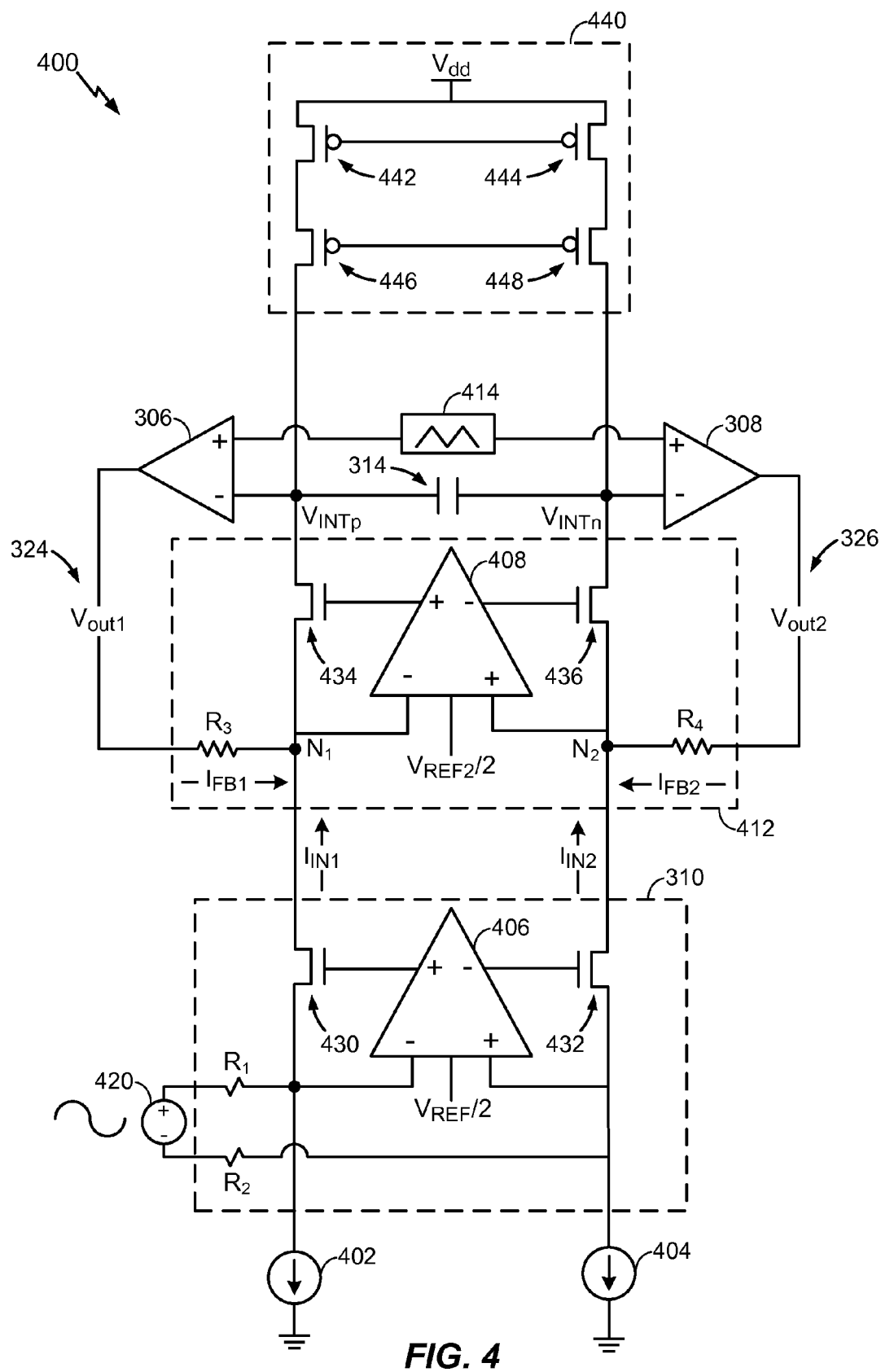
FIG. 4 is a diagram that depicts an exemplary embodiment of a portion of an integrator that is operable to increase PSRR of a Class D audio amplifier.

Referring to FIG. 4, an exemplary embodiment of a portion of an integrator 400 that is operable to increase power supply rejection ratio (PSRR) of a Class D audio amplifier is shown. In an exemplary embodiment, the integrator 400 may correspond to the integrator 302 of FIG. 3.

The integrator 400 includes the first and second differential amplifiers 306, 308 (e.g., the comparator circuits), the input converter 310, and a feedback converter 412. In an exemplary embodiment, the feedback converter 412 may correspond to the first feedback converter 312 of FIG. 3 and the second feedback converter 313 of FIG. 3. For example, the feedback converter 412 may be a voltage-to-current converter.

An input voltage source 420 may generate a pair of differential input voltage signals. In an exemplary embodiment, the input voltage source 420 may generate the first differential input voltage signal 320 of FIG. 3 and the second differential input voltage signal 322 of FIG. 3. The pair of differential input voltage signals may be provided to the input converter 310.

The input converter 310 may include a first differential operational amplifier 406, a first resistor ($R_1$), a second resistor ($R_2$), a first transistor 430, and a second transistor 432. In an exemplary embodiment, the first transistor 430 and the second transistor 432 are n-type metal oxide semiconductor (NMOS) transistors. A gate of the first transistor 430 is coupled to a positive output terminal of the first differential operational amplifier 406, and a gate of the second transistor 432 is coupled to a negative output terminal of the first differential operational amplifier 406. A source of the first transistor 430 is coupled to a first current source 402, and a source of the second transistor 432 is coupled to a second current source 404. In an exemplary embodiment, the first current source 402 and the second current source 404 generate a substantially equal amount of current.

The first resistor ($R_1$) may convert the first differential input voltage signal into a current signal, and the second resistor ($R_2$) may convert the second differential input voltage signal into a current signal. A first voltage associated with the first differential input voltage signal may be provided to a negative input terminal of the first differential operational amplifier 406, and a second voltage associated with the second differential voltage signal may be provided to a positive input terminal of the first differential operational amplifier 406.

The first differential operational amplifier 406 may compare the first and second voltages with a reference voltage ($V_{REF}$). For example, the first voltage may be compared to half of the reference voltage ($V_{REF}/2$), and the second voltage may be compared to half of the reference voltage ($V_{REF}/2$). The first transistor 430 may conduct current based on the current from the first current source 402 (combined with current from the first resistor ($R_1$)) may be sourced through the first transistor 430 to the first node ($N_1$) as the first differential input current signal ($I_{IN1}$). The second transistor 432 may conduct current based on the current from the second current source (combined with current from the second resistor ($R_2$)) may be sourced through the second transistor 432 to the second node ($N_2$) as the second differential input current signal ($I_{IN2}$).

The feedback converter 412 may include a second differential operational amplifier 408, a third resistor ($R_3$), a fourth resistor ($R_4$), a third transistor 434, and a fourth transistor 436. In an exemplary embodiment, the third transistor 434 and the fourth transistor 436 are NMOS transistors. A gate of the third transistor 434 is coupled to a positive output terminal of the second differential operational amplifier 408, and a gate of the fourth transistor 436 is coupled to a negative output terminal of the second differential operational amplifier 408. A source of the third transistor 434 is coupled to the first node ($N_1$), and a source of the fourth transistor 436 is coupled to the second node ($N_2$).

The first differential output voltage signal ($V_{out1}$) may be provided to the feedback converter 412 via the first feedback path 324, and the second differential output voltage signal ($V_{out2}$) may be provided to the feedback converter 412 via the second feedback path 326. The third resistor ($R_3$) may convert the first differential output voltage signal ($V_{out1}$) into the first feedback current signal ($I_{FB1}$), and the fourth resistor ($R_4$) may convert the second differential output voltage signal ($V_{out2}$) into the second feedback current signal ($I_{FB2}$). The first feedback current signal ($I_{FB1}$) may be combined with the first differential input current signal ($I_{IN1}$) at the first node ($N_1$) to generate the first combined current signal, and the second feedback current signal ($I_{FB2}$) may be combined with the second differential input current signal ($I_{IN2}$) at the second node ($N_2$) to generate the second combined signal.

The second operational amplifier 308 may compare a first voltage associated with the first differential output voltage signal ($V_{out1}$) and a second voltage associated with the second differential output voltage signal ($V_{out2}$) with a second reference voltage ($V_{REF2}$). For example, the first voltage may be compared to half of the second reference voltage ($V_{REF2}/2$), and the second voltage may be compared to half of the second reference voltage ($V_{REF2}/2$). The third transistor 434 may conduct current based on the 1 the first combined current may be sourced through the third transistor 434 to charge the capacitor 314. The fourth transistor 436 may conduct current based on the second combined current may be sourced through the fourth transistor 436 to discharge the capacitor 314.

The positive terminal of the capacitor 314 may be coupled to the negative terminal of the first differential amplifier 306, and the negative terminal of the capacitor 314 may be coupled to the negative terminal of the second differential amplifier 308. Thus, the capacitor 314 may provide a voltage to the negative terminal of the first differential amplifier 306, and the capacitor 314 may provide a voltage to the negative terminal of the second differential amplifier 308.

An oscillator 414 configured to generate a triangle waveform may be coupled to the positive input terminals of the differential amplifiers 306, 308. The first differential amplifier 306 may be configured to compare the first integrator output voltage ($V_{INTp}$) with the triangle waveform. When the value (e.g., voltage level) of the first integrator output voltage ($V_{INTp}$) is greater than the value of the triangle waveform, the first differential amplifier 306 generates a pulse width modulation signal having a logically high voltage level. The pulse width modulation signal may drive a first power switch (not shown) coupled to the output of the first differential amplifier 306 to generate the first differential output voltage signal ($V_{out1}$). When the value of the first integrator output voltage ($V_{INTp}$) is less than the value of the triangle waveform, the first differential amplifier 306 generates a pulse width modulation signal having a logically low voltage level. The second differential amplifier 308 may be configured to compare the second integrator output voltage ($V_{INTn}$) to the triangle waveform. When the value (e.g., voltage level) of the second integrator output voltage ($V_{INTn}$) is greater than the value of the triangle waveform, the second differential amplifier 308 generates a pulse width modulation signal having a logically high voltage level. The pulse width modulation signal may drive a second power switch (not shown) coupled to the output of the second differential amplifier 308 to generate the second differential output voltage signal ($V_{out2}$). When the value of the second integrator output voltage ($V_{INTn}$) is less than the value of the triangle waveform, the second differential amplifier 308 generates a pulse width modulation signal having a logically low voltage level. It will be appreciated that a size of the capacitor 314 may be reduced to approximately twenty-five percent of the size of a capacitor typically used for an active resistor-capacitor integrator, which reduces die area.

The integrator 400 may also include transistor circuitry 440 coupled to provide a substantially constant current to each terminal of the capacitor 314. The transistor circuitry 440 may include a fifth transistor 442, a sixth transistor 444, a seventh transistor 446, and an eighth transistor 448. In an exemplary embodiment, each transistor 442-448 may be a p-type metal oxide semiconductor (PMOS) transistor. The source of the fifth transistor 442 and the source of the sixth transistor 444 may be coupled to a supply voltage ($V_{dd}$). A drain of the fifth transistor 442 may be coupled to a source of the seventh transistor 446, and a drain of the sixth transistor 444 may be coupled to a source of the eighth transistor 448. As described with respect to FIG. 5, the gate of the fifth transistor 442 and the gate of the sixth transistor 444 may be coupled to a first common-mode feedback circuit, and the gate of the seventh transistor 446 and the gate of the eighth transistor 448 may be coupled to a second common-mode feedback circuit.

The integrator 400 may increase a PSRR of a Class D audio amplifier while reducing die area. For example, the input converter 310 and the feedback converter 412 may provide high impedance at the feedback nodes looking towards the input converter 310 (e.g., the first node ($N_1$) and the second node ($N_2$)) by converting voltage signals into current signals. As a result, the PSRR is less sensitive to the feedback resistors (e.g., the third resistor ($R_3$) and the fourth resistor ($R_4$)). The reduced sensitivity may enable enhanced (e.g., increased) PSRR with relatively small input resistors (e.g., the first resistor ($R_1$) and the second resistor ($R_2$)), which reduces die area.

Figure 5:
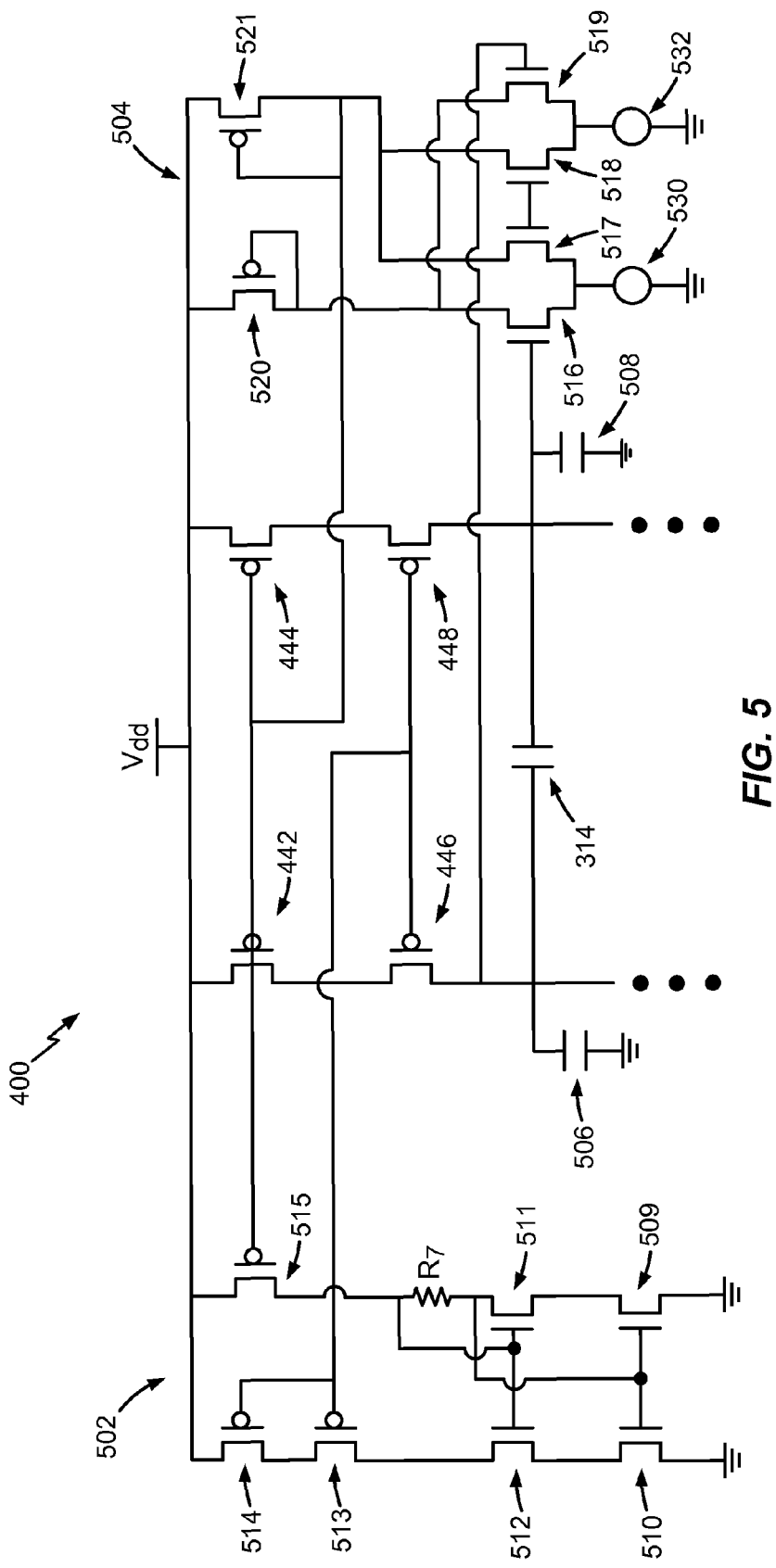
FIG. 5 is a diagram that depicts an exemplary embodiment of common-mode circuitry of the integrator of FIG. 4.

Referring to FIG. 5, an exemplary embodiment of common-mode circuitry of the integrator 400 that is operable to increase power supply rejection ratio (PSRR) of a Class D audio amplifier is shown. The integrator 400 may further include a first common-mode feedback circuit 502 and a second common-mode feedback circuit 504.

The first common-mode feedback circuit 502 may include a ninth transistor 509 and a tenth transistor 510. In an exemplary embodiment, the ninth transistor 509 and the tenth transistor 510 are NMOS transistors. A source of the ninth transistor 509 is coupled to ground, and a source of the tenth transistor 510 is coupled to ground. A drain of the ninth transistor 509 is coupled to a source of an eleventh transistor 511, and a drain of the tenth transistor 510 is coupled to a source of a twelfth transistor 512. In an exemplary embodiment, the eleventh transistor 511 and the twelfth transistor 512 are NMOS transistors. The gates of the ninth and tenth transistors 509, 510 are coupled to a source of the eleventh transistor 511.

A source of the eleventh transistor is coupled to a first terminal of a seventh resistor ($R_7$), and a source of the twelfth transistor 512 is coupled to a drain of a thirteenth transistor 513. The gates of the eleventh and twelfth transistors 511, 512 are coupled to a second terminal of the seventh resistor ($R_7$). A source of the thirteenth transistor 513 is coupled to a drain of a fourteenth transistor 514. In an exemplary embodiment, the thirteenth transistor 513 and the fourteenth transistor 514 are PMOS transistors. The gates of the thirteenth and fourteenth transistors 513, 514 are coupled to the gates of the seventh and eighth transistors 446, 448. The second terminal of the seventh resistor ($R_7$) is coupled to a drain of a fifteenth transistor 515. In an exemplary embodiment, the fifteenth transistor 515 is a PMOS transistor. The gate of the fifteenth transistor 515 is coupled to the gates of the fifth and sixth transistors 442, 444. The sources of the fourteenth and fifteenth transistors 514, 515 are coupled to the power supply ($V_{dd}$).

The second common-mode feedback circuit 504 includes a third current source 530 and a fourth current source 532. A first terminal of the third current source 530 is coupled to a source of a sixteenth transistor 516 and to a source of a seventeenth transistor 517. In an exemplary embodiment, the sixteenth and seventeenth transistors 516, 517 are NMOS transistors. A second terminal of the third current source 530 is coupled to ground. A first terminal of the fourth current source 532 is coupled to a source of an eighteenth transistor 518 and to a source of a nineteenth transistor 519. In an exemplary embodiment, the eighteenth and nineteenth transistors 518, 519 are NMOS transistors. The gate of the eighteenth transistor 518 is coupled to the gate of the seventeenth transistor 517, and the gate of the nineteenth transistor 519 is coupled to the drain of the seventh transistor 446. The gate of the sixteenth transistor 516 is coupled to the capacitor 314.

A drain of the sixteenth transistor 516 is coupled to a drain of a twentieth transistor 520 and to a drain of the nineteenth transistor 519. A drain of a twenty-first transistor 521 is coupled to a drain of the seventeenth transistor 517 and to a drain of the eighteenth transistor 518. In an exemplary embodiment, the twentieth transistor 520 and the twenty-first transistor 521 are PMOS transistors. The sources of the twentieth and twenty-first transistors 520, 521 are coupled to the power supply ($V_{dd}$). A gate of the twentieth transistor 520 is coupled to the drain of the twentieth transistor 520. A gate of the twenty-first transistor 521 is coupled to the drain of the twenty-first transistor 521 and to the gates of the fifth and sixth transistors 442, 444. A first auxiliary capacitor 506 is coupled to a first terminal of the capacitor 314 and to ground. A second auxiliary capacitor 508 is coupled to a second terminal of the capacitor and to ground.

The common mode feedback circuitry in FIG. 5 may provide a common mode voltage to the current sources of the transistor circuitry 440 in FIG. 4. The common mode voltage of the seventh and eighth transistors 446, 448 in FIG. 5 may be designed to track the common mode voltage of the fifth and sixth transistors 442, 444. The tracking property may be completed by biasing characteristics of the first common-mode feedback circuit 502. The tracking common-mode approach increases the output swing ($V_{INTP}$, $V_{INTN}$) of the integrator 400 in FIG. 4.

Figure 6:
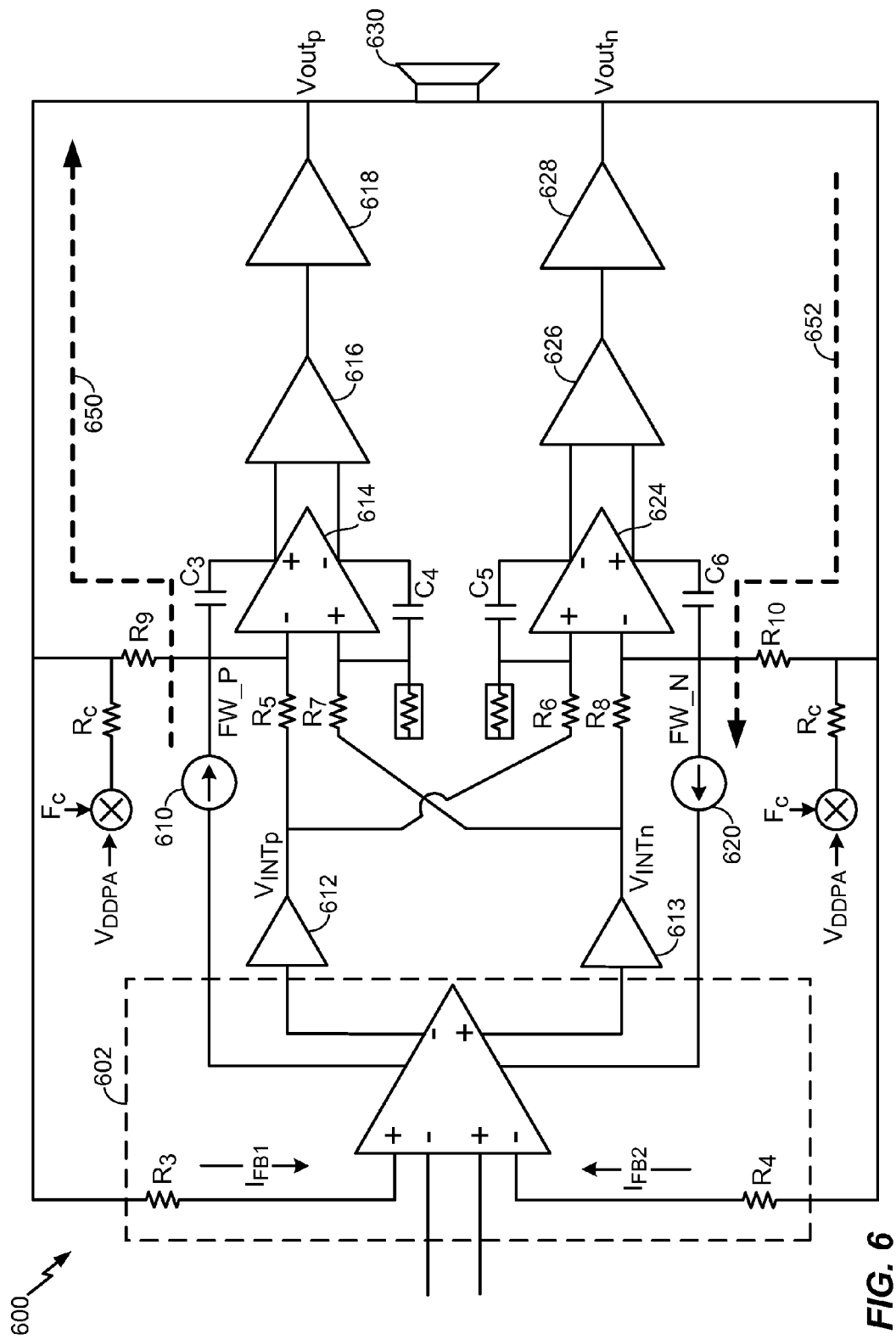
FIG. 6 is a diagram that depicts an exemplary embodiment of a system that includes an integrator that is operable to increase PSRR of a Class D audio amplifier.

Referring to FIG. 6, an exemplary embodiment of a system 600 that includes an integrator that is operable to increase PSRR of a Class D audio amplifier is shown. In an exemplary embodiment, the system 600 may correspond to a Class D audio amplifier, and the system 600 may include an integrator 602. In an exemplary embodiment, the integrator 602 may correspond to the integrator 302 of FIG. 3, the integrator 400 of FIGS. 4-5, or any combination thereof.

A first buffer 612 may be coupled to provide a first integrator output ($V_{INTp}$) of the integrator 602, and a second buffer 613 may be coupled to provide a second integrator output ($V_{INTn}$) of the integrator 602. The first integrator output ($V_{INTp}$) may be converted to a current signal via a fifth resistor ($R_5$) and a sixth resistor ($R_6$) to selectively charge and discharge a capacitor ($C_3$) coupled to a negative input terminal of a first differential amplifier 614 and to selectively charge and discharge a capacitor ($C_5$) coupled to a positive terminal of a second differential amplifier 624, respectively. The second integrator output ($V_{INTn}$) may be converted to a current signal via a seventh resistor ($R_7$) and an eighth resistor ($R_8$) to selectively charge and discharge a capacitor ($C_4$) coupled to a positive input terminal of the first differential amplifier 614 and to selectively charge and discharge a capacitor ($C_6$) coupled to a negative terminal of the second differential amplifier 624. The differential amplifiers 614, 624 may be included in a second integrator.

Outputs of the second integrator may drive comparators 616, 626, which in turn, may drive the power switches 618, 628. The first power switch 618 may generate a first differential output voltage signal ($V_{OUTp}$), and the second power switch 628 may generate a second differential output voltage signal ($V_{OUTn}$). In an exemplary embodiment, the first differential output voltage signal ($V_{OUTp}$) corresponds to the first differential output voltage signal ($V_{out1}$) of FIG. 3, and the second differential output voltage signal ($V_{OUTn}$) corresponds to the second differential output voltage signal ($V_{out2}$) of FIG. 3.

The first differential output voltage signal ($V_{OUTp}$) and the second differential output voltage signal ($V_{OUTn}$) may be provided to a speaker 630. In addition, the differential output voltage signals ($V_{OUTp}$, $V_{OUTn}$) may be converted into current signals using feedback paths coupled to inputs of the integrator 602. For example, the differential output voltage signals ($V_{OUTp}$, $V_{OUTn}$) may be converted into the feedback current signals ($I_{FB1}$, $I_{FB2}$) via the third resistor ($R_3$) and the fourth resistor ($R_4$), respectively, in a similar manner as described with respect to FIG. 4. The differential output voltage signals ($V_{OUTp}$, $V_{OUTn}$) may also be converted into current signals via feedback paths associated with a ninth resistor ($R_9$) and a tenth resistor ($R_{10}$). The current signals generated via the ninth and tenth resistors ($R_9$, $R_{10}$) may be provided to the integrator outputs ($V_{INTp}$, $V_{INTn}$) through the fifth and eighth resistors ($R_5$, $R_8$), respectively, which may cause a voltage swing at the output of the integrator 602.

A first current source 610 associated with the integrator 602 may be configured to generate a first cancellation current 650 (e.g., a feed-forward current) that propagates through node FW_P and the ninth resistor ($R_9$). The first cancellation current 650 may offset (e.g., cancel) the current associated with the portion of the first differential output voltage signal ($V_{OUTp}$) provided to the first integrator output ($V_{INTp}$). The magnitude of the first cancellation current 650 may be adjusted by selectively activating and deactivating transistors within a current mirror circuit, as described with respect to FIG. 7. In a similar manner, a second current source 620 may generate a second cancellation current 652 (e.g., a feed-forward current) that propagates through node FW_N and the tenth resistor ($R_{10}$). The second cancellation current 652 may offset the current associated with the portion of the second differential output voltage signal ($V_{OUTn}$) provided to the second integrator output ($V_{INTn}$).

The first cancellation current 650 may substantially inhibit the current associated with the portion of the first differential output voltage signal ($V_{OUTp}$) provided to the first integrator output ($V_{INTp}$), which may reduce the output signal swing of the integrator 602. In a similar manner, the second cancellation current 652 may substantially inhibit the current associated with the portion of the second differential output voltage signal ($VOUT_n$) provided to the output ($V_{INTn}$), which may reduce the output signal swing of the integrator 602.

Reducing the output signal swing of the integrator 602 (e.g., a first integrator swing) may improve linearity by avoiding devices of integrator 602 to switch between different operational regions Switching operational region from one to the other due to relative large swing may cause distortion. Reducing the first integrator swing may also enable a smaller integrator capacitor by reducing a gain of a second stage (e.g., gain associated with the differential amplifiers 614, 624) without degrading linearity.

Figure 7:
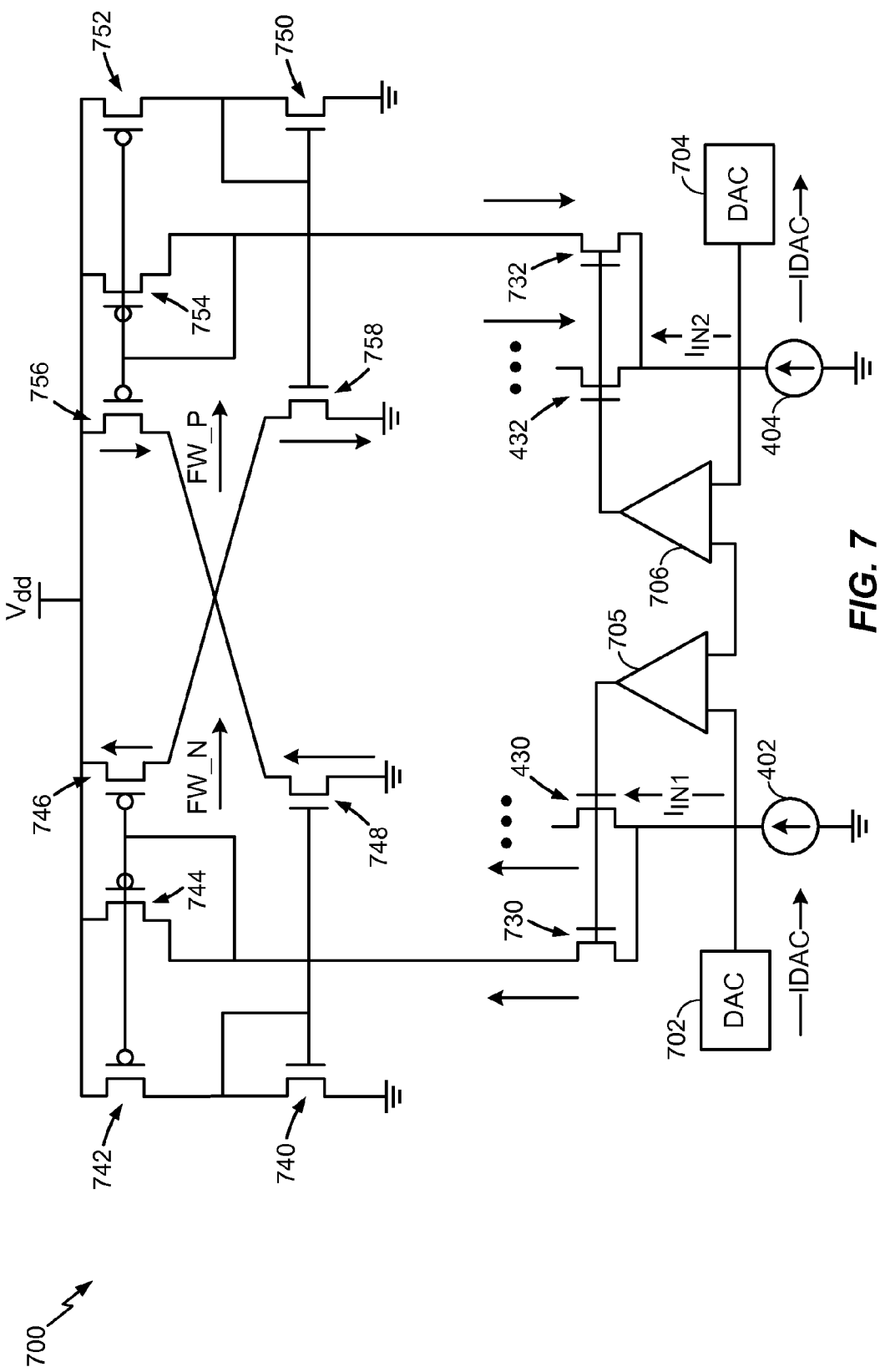
FIG. 7 is a diagram that depicts an exemplary embodiment of a circuit to reduce an integrator swing.

Referring to FIG. 7, an exemplary embodiment of a circuit 700 to reduce an integrator swing is shown. In an exemplary embodiment, the circuit 700 may be coupled to (or included in) the integrator 602 of FIG. 6.

The circuit 700 may include a first operational amplifier 705 and a second operational amplifier 706. In an exemplary embodiment, the first operational amplifier 705 and the second operational amplifier 706 may correspond to the first differential operational amplifier 406 of FIG. 4. A first digital-to-analog converter (DAC) 702 may be coupled to generate a first current signal (IDAC). The first current signal (IDAC) may be summed with the first differential input current signal ($I_{IN1}$) of FIG. 4 to generate a first summation current signal. A second DAC 704 may be coupled to generate a second current signal (IDAC). The second current signal (IDAC) may be summed with the second differential input current signal ($I_{IN2}$) of FIG. 4 to generate a second summation current signal.

The first summation current signal may be mirrored through the first transistor 430 to a first auxiliary transistor 730. The second summation current signal may be mirrored through the second transistor 432 to a second auxiliary transistor 732. In an exemplary embodiment, the first auxiliary transistor 730 and the second auxiliary transistor 732 are NMOS transistors.

A first auxiliary circuit includes a third auxiliary transistor 740, a fourth auxiliary transistor 742, a fifth auxiliary transistor 744, a sixth auxiliary transistor 746, and a seventh auxiliary transistor 748. In an exemplary embodiment, the fourth, fifth, and sixth auxiliary transistors 742-746 are PMOS transistors, and the third and seventh auxiliary transistors 740, 748 are NMOS transistors. The source of the third auxiliary transistor 740 and the source of the seventh auxiliary transistor 748 are coupled to ground. The drain of the third auxiliary transistor 740 is coupled to a drain of the fourth auxiliary transistor 742 and to a gate of the third auxiliary transistor 740. The sources of the fourth, fifth, and sixth auxiliary transistors 742-746 are coupled to the power supply ($V_{dd}$). The gates of the fifth, sixth, and seventh auxiliary transistors 744, 746, 748 are coupled to receive the mirrored first summation current signal. Although depicted as a single transistor, the first auxiliary transistor 730 may include an array of transistors that are selectively activated by a digital code. For example, the digital code may control an amount of the first summation current that is mirrored to the drain of the sixth auxiliary transistor 746 (FW_N) to control the first cancellation current 650 (e.g., the feed-forward current).

A second auxiliary circuit includes an eighth auxiliary transistor 750, a ninth auxiliary transistor 752, a tenth auxiliary transistor 754, an eleventh auxiliary transistor 756, and a twelfth auxiliary transistor 758. In an exemplary embodiment, the ninth, tenth, and eleventh auxiliary transistors 752-756 are PMOS transistors, and the eighth and twelfth auxiliary transistors 750, 758 are NMOS transistors. The source of the eighth auxiliary transistor 750 and the source of the twelfth auxiliary transistor 758 are coupled to ground. The drain of the eighth auxiliary transistor 750 is coupled to a drain of the ninth auxiliary transistor 752 and to a gate of the eighth auxiliary transistor 750. The sources of the ninth, tenth, and eleventh auxiliary transistors 752-756 are coupled to the power supply ($V_{dd}$). The gates of the tenth, eleventh, and twelfth auxiliary transistors 754, 758 are coupled to receive the mirrored second summation current signal. Although depicted as a single transistor, the second transistor 732 may include an array of transistors that are selectively activated by a digital code. For example, the digital code may control an amount of the second summation current that is mirrored to the drain of the eleventh auxiliary transistor 756 (FW_P) to control the second cancellation current 652 (e.g., the feed-forward current).

Thus, the circuit 700 of FIG. 7 may provide an analog interface with a DAC to reduce an integrator swing of an integrator (e.g., the integrator 602 of FIG. 6). For example, digital codes may be provided to the DACs 702, 704 to adjust an amount of cancellation current (e.g., the cancellation currents 650, 652 of FIG. 6). Reducing the integrator swing may also enable a smaller integrator capacitor by reducing a gain of a second stage (e.g., gain associated with the differential operational amplifiers 614, 624) without degrading linearity.

Figure 8:
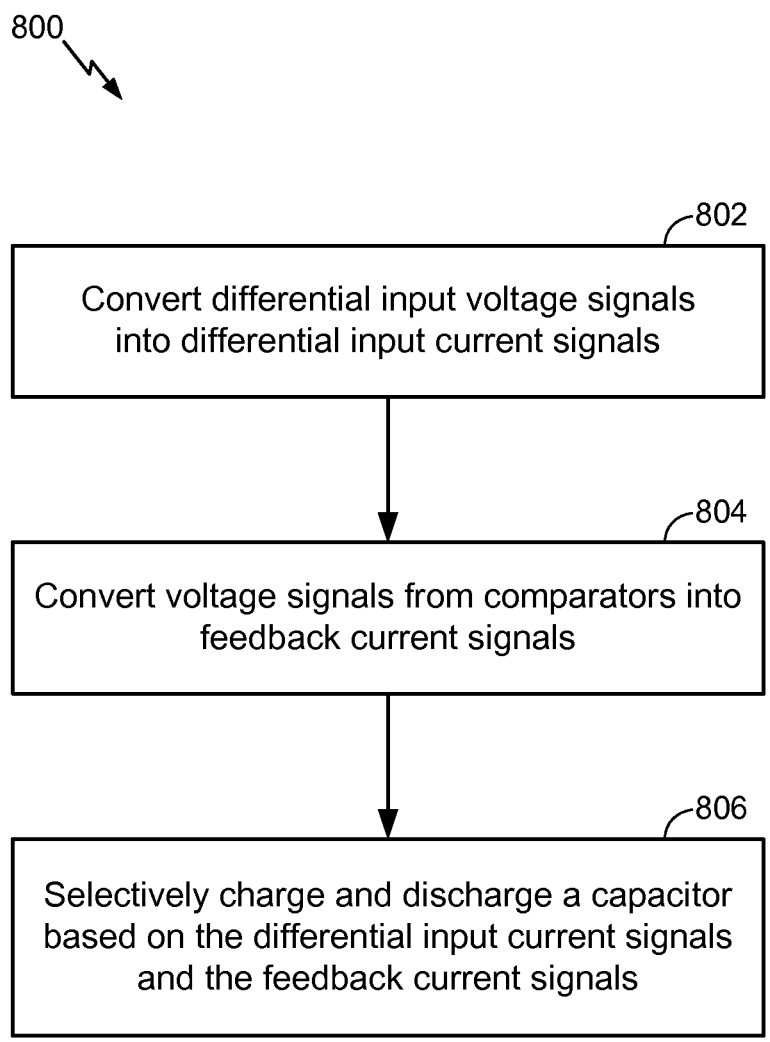
FIG. 8 is a flowchart that illustrates an exemplary embodiment of a method for operating a Class D audio amplifier.

Referring to FIG. 8, a flowchart that illustrates an exemplary embodiment of a method 800 for operating a Class D audio amplifier is shown. In an illustrative embodiment, the method 800 may be performed by circuitry within the wireless device 110 of FIGS. 1-2, the system 300 of FIG. 3, the integrator 400 of FIGS. 4-5, the system 600 of FIG. 6, the circuit 700 of FIG. 7, or any combination thereof.

The method 800 includes converting differential input voltage signals into differential input current signals, at 802. For example, referring to FIG. 3, the input converter 310 may convert the pair of differential input voltage signals 320, 322 into the pair of differential input current signals ($I_{IN1}$, $I_{IN2}$). For example, the input converter 310 may convert the first differential input voltage signal 320 into the first differential input current signal ($I_{IN1}$), and the input converter 310 may convert the second differential input voltage signal 322 into the second differential input current signal ($I_{IN2}$).

Output voltage signals from comparators may be converted into feedback current signals, at 804. For example, referring to FIG. 3, the first feedback converter 310 may convert the first differential output voltage signal ($V_{out1}$) into the first feedback current signal ($I_{FB1}$), and the second feedback converter 312 may convert the second differential output voltage signal ($V_{out2}$) into the second feedback current signal ($I_{FB2}$).

A capacitor may be selectively charged and discharged based on the differential input current signals and the feedback current signals, at 806. For example, referring to FIG. 3, the first differential output current signal ($I_{out1}$) may be combined (e.g., summed) with the first feedback current signal ($I_{IN1}$) at the first node ($N_1$) to generate the first combined current signal, and the second differential output current signal ($I_{out2}$) may be combined (e.g., summed) with the second feedback current signal ($I_{IN2}$) at the second node ($N_2$) to generate the second combined current signal. The combined current signals may drive (e.g., charge and discharge) the capacitor 314 (e.g., a single differential integrating capacitor). For example, the first combined current signal may charge the capacitor 314 for a portion of a duty cycle (e.g., when the first combined current signal is based on high voltage levels associated with the first differential output voltage signal ($V_{out1}$) and the first differential input voltage signal 320), and the second combined current signal may discharge the capacitor 314 for the other portion of the duty cycle (e.g., when the second combined current signal is based on high voltage levels associated with the second differential output voltage signal ($V_{out2}$) and the first differential input voltage signal 322).

The method 800 of FIG. 8 may be performed by a Class D audio amplifier with reduced die area. For example, the size of the capacitor 314 may be reduced to approximately twenty-five percent of the size of a capacitor typically used for an active resistor-capacitor integrator. In addition, PSRR is not sensitive (or is less sensitive) to the matching of the feedback networks (e.g., the resistors in the input converter 310 coupled to receive the pair of differential input voltage signals 320, 322 and the feedback resistors in the feedback converters 312, 313). Thus, resistor size can be reduced.

Typically, the resistor size (width×length) of both input and feedback resistors is large (compared to the size of the resistors in the input converter 310 and the size of the resistors in the feedback converters 312, 313) to increase the matching and thus improve PSRR. However, the input converter 310 may provide a high impedance at the first node ($N_1$) and the second node ($N_2$) by converting the pair of differential input voltage signals 320, 322 into the pair of differential input current signals ($I_{IN1}$, $I_{IN2}$). As a result, the PSRR is less sensitive to the feedback and input resistors. The reduced sensitivity may enable enhanced (e.g., increased) PSRR with relatively small input resistors, which reduces die area.

In conjunction with the described embodiments, an apparatus includes means for converting differential input voltage signals into differential input current signals. For example, the means for converting the differential input voltage signals into the differential input current signals may include the input converter 310 of FIGS. 3-4, the first differential operational amplifier 406 of FIG. 4, the first transistor 430 of FIG. 4, the second transistor 432 of FIG. 4, the first resistor ($R_1$) of FIG. 4, the second resistor ($R_2$) of FIG. 4, the integrator 602 of FIG. 6, one or more other devices, circuits, modules, or instructions to convert the differential input voltage signals into the differential input current signals, or any combination thereof.

The apparatus may also include means for converting output voltage signals into feedback current signals. For example, the means for converting the output voltage signals into the feedback current signals may include the first feedback converter 312 of FIG. 3, the second feedback converter 313 of FIG. 3, the feedback converter 412 of FIG. 4, the second differential operational amplifier 408 of FIG. 4, the third transistor 434 of FIG. 4, the fourth transistor 436 of FIG. 4, the third resistor (R3) of FIG. 4, the fourth resistor (R4) of FIG. 4, the integrator 602 of FIG. 6, one or more other devices, circuits, modules, or instructions to convert the output voltage signals into the feedback current signals, or any combination thereof.

The apparatus may also include means for storing energy. The means for storing energy may be a capacitor that is selectively charged and discharged based on the pair of differential input current signals and the pair of feedback current signals. For example, the means for storing energy may include the capacitor 314 of FIGS. 3-5, the integrator 602 of FIG. 3, one or more other devices, circuits, modules, or any combination thereof.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. For example, digital codes provided to the DACs 702, 704 may be implemented using software that is executable by a processor. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
voltage-to-current conversion circuitry comprising a first voltage-to-current converter having a differential output and a second voltage-to-current converter, the first voltage-to-current converter comprising an input voltage-to-current converter, the second voltage-to-current converter comprising a first feedback voltage-to-current converter and a second feedback voltage-to-current converter; and
a capacitor coupled to the first voltage-to-current converter and to the second voltage-to-current converter, wherein the first voltage-to-current converter and the second voltage-to-current converter are configured to selectively charge and discharge the capacitor.

2. An apparatus comprising:
voltage-to-current conversion circuitry comprising a first voltage-to-current converter having a differential output and a second voltage-to-current converter, the first voltage-to-current converter comprising an input voltage-to-current converter, the second voltage-to-current converter comprising a first feedback voltage-to-current converter and a second feedback voltage-to-current converter; and
a capacitor coupled to the first voltage-to-current converter and to the second voltage-to-current converter, wherein the first voltage-to-current converter is configured to output a first output current to a first terminal of the capacitor and to output a second output current to a second terminal of the capacitor.

3. An apparatus comprising:
voltage-to-current conversion circuitry comprising a first voltage-to-current converter having a differential output and a second voltage-to-current converter, the first voltage-to-current converter comprising an input voltage-to-current converter, the second voltage-to-current converter comprising a first feedback voltage-to-current converter and a second feedback voltage-to-current converter;
a capacitor coupled to the first voltage-to-current converter and to the second voltage-to-current converter;
a first comparator configured to compare a voltage level at a positive terminal of the capacitor to a voltage level of a signal; and
a second comparator configured to compare a voltage level at a negative terminal of the capacitor to the voltage level of the signal.

4. The apparatus of claim 3, wherein the first comparator is configured to generate a first pulse width modulation signal based on the comparison of the voltage level at the positive terminal of the capacitor to the voltage level of the signal, and wherein the second comparator is configured to generate a second pulse width modulation signal based on the comparison of the voltage level at the negative terminal of the capacitor to the voltage level of the signal.

5. The apparatus of claim 4, further comprising:
a first power switch coupled to receive the first pulse width modulation signal; and
a second power switch coupled to receive the second pulse width modulation signal.

6. The apparatus of claim 1, further comprising a common mode circuit coupled to a first terminal of the capacitor and to a second terminal of the capacitor.

7. The apparatus of claim 1, further comprising feed-forward biasing circuitry coupled to generate a feed-forward current, the feed-forward current provided to an output of an integrator that includes the voltage-to-current conversion circuitry and the capacitor to reduce a voltage swing at the output of the integrator.

8. The apparatus of claim 7, wherein the output of the integrator is a differential output, and wherein the feed-forward current includes a first feed-forward current provided to a first output of the differential output of the integrator and a second feed-forward current provided to a second output of the differential output of the integrator.

9. A method comprising:
converting differential input voltage signals into differential input current signals;
converting voltage signals from comparators into feedback current signals, the converting voltage signals comprising converting a first voltage signal from a first comparator into a first feedback current signal and converting a second voltage signal from a second comparator into a second feedback current signal; and
selectively charging and discharging a capacitor based on the differential input current signals and the feedback current signals.

10. The method of claim 9, further comprising comparing a voltage level of a signal to a voltage at a first terminal of the capacitor to generate a first pulse width modulated signal.

11. The method of claim 10, further comprising comparing the voltage level of the signal to a voltage at a second terminal of the capacitor to generate a second pulse width modulated signal.

12. An apparatus comprising:
means for converting input voltage signals into first current signals, the means for converting input voltage signals into first current signals having a differential output;
means for converting voltage signals into second current signals, the means for converting voltage signals into second current signals comprising means for converting a first feedback voltage into one current signal and means for converting a second feedback voltage into another current signal; and
means for storing energy coupled to the means for converting input voltage signals into first current signals and coupled to the means for converting voltage signals into second current signals, wherein the means for converting input voltage signals into first current signals and the means for converting voltage signals into second current signals are configured to selectively charge and discharge the means for storing energy.

13. The apparatus of claim 12, further comprising means for comparing a voltage level of a signal to a voltage at a positive terminal of the means for storing energy to generate a first pulse width modulated signal.

14. The apparatus of claim 13, further comprising means for comparing the voltage level of the signal to a voltage at a negative terminal of the means for storing energy to generate a second pulse width modulated signal.

15. The apparatus of claim 14, further comprising:
first switching means coupled to receive the first pulse width modulated signal; and
second switching means coupled to receive the second pulse width modulated signal.

16. The apparatus of claim 12, further comprising means for generating a feed-forward current, the means for generating the feed-forward current coupled to an output of the means for converting voltage signals into second current signals to reduce a voltage swing at the output of the means for converting voltage signals into second current signals.

17. The apparatus of claim 1, wherein a first differential output of the voltage-to-current converter is coupled to a first node and an output of the first feedback voltage-to-current converter is coupled to the first node, and wherein a second differential output of the voltage-to-current converter is coupled to a second node and an output of the second feedback voltage-to-current converter is coupled to the second node.

18. The apparatus of claim 12, wherein the first current signals are respectively combined with the one current signal and the another current signal at a first node and a second node, and wherein the means for storing energy is coupled between the first node and the second node.

19. The apparatus of claim 1, wherein the first voltage-to-current converter further comprises a first differential amplifier.

20. The apparatus of claim 19, wherein the second voltage-to-current converter further comprises a second differential amplifier.

* * * * *